United States Patent
Wirth

(10) Patent No.: US 10,923,374 B1
(45) Date of Patent: Feb. 16, 2021

(54) WALKING BEAM CHAMBER

(71) Applicant: Applied Materials, Inc., Santa Clara, CA (US)

(72) Inventor: Paul Wirth, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/519,535

(22) Filed: Jul. 23, 2019

(51) Int. Cl.
    *H01L 21/677* (2006.01)
    *H01L 21/687* (2006.01)
    *B65G 25/02* (2006.01)

(52) U.S. Cl.
    CPC .... *H01L 21/67736* (2013.01); *H01L 21/6776* (2013.01); *H01L 21/67706* (2013.01); *H01L 21/67727* (2013.01); *H01L 21/67742* (2013.01); *H01L 21/67745* (2013.01); *H01L 21/68707* (2013.01); *H01L 21/68742* (2013.01); *B65G 25/02* (2013.01)

(58) Field of Classification Search
    CPC ....... B65G 25/02; H01L 21/68; H01L 21/302; H01L 21/67736; H01L 21/67706; H01L 21/67727; H01L 21/67742; H01L 21/67745; H01L 21/6776; H01L 21/68707; H01L 21/68742; B25J 5/02
    USPC .............................. 198/750.14, 750.2–750.8
    See application file for complete search history.

(56) References Cited

U.S. PATENT DOCUMENTS

| | | | | |
|---|---|---|---|---|
| 3,973,665 A | * | 8/1976 | Giammanco | B23Q 7/003 198/775 |
| 4,275,978 A | * | 6/1981 | Brooks | B65G 25/02 198/763 |
| 4,591,044 A | * | 5/1986 | Ogami | B23Q 7/006 198/346.3 |
| 6,298,685 B1 | * | 10/2001 | Tepman | C23C 14/568 62/378 |
| 7,185,754 B2 | * | 3/2007 | Taylor | B65G 47/72 198/750.14 |
| 7,886,686 B2 | * | 2/2011 | Fourezon | C23C 14/568 118/500 |
| 2003/0183491 A1 | * | 10/2003 | Biro | B65G 25/02 198/750.2 |
| 2008/0314892 A1 | * | 12/2008 | Graham | F26B 3/30 219/388 |
| 2010/0116990 A1 | * | 5/2010 | Xu | G01B 11/0683 250/339.06 |
| 2013/0157407 A1 | * | 6/2013 | Liu | C23C 14/5866 438/95 |
| 2017/0130336 A1 | * | 5/2017 | Fujikura | C23C 16/44 |
| 2017/0282270 A1 | * | 10/2017 | Kagaya | H01L 24/75 |

FOREIGN PATENT DOCUMENTS

JP      59-72739      *   4/1984      ............. H01L 21/68

* cited by examiner

*Primary Examiner* — James R Bidwell
(74) *Attorney, Agent, or Firm* — Lowenstein Sandler LLP

(57) ABSTRACT

Disclosed is a device fabrication system comprising a wafer input loadlock, a wafer output loadlock, one or more wafer processing regions, and one or more walking beams for transporting one or more wafers from the wafer input loadlock through the wafer processing regions, and onto the wafer output loadlock. Also disclosed are methods for transporting one or more wafers through the device fabrication system described herein.

18 Claims, 6 Drawing Sheets

WALKING BEAM CHAMBER

FIELD OF THE DISCLOSURE

Embodiments of the present disclosure relate generally to device fabrication systems, and is more particularly concerned with a walking beam chamber design, and methods for transporting wafers therein.

BACKGROUND OF THE DISCLOSURE

Processing wafers may involve a sequence of similar or different procedures such as etching, thin film deposition, cleaning and so on. The processing steps may be performed in a single device fabrication system including a plurality of distinct processing chambers. The wafers may be transported from one processing chamber to another. The amount of wafers processed through a fabrication system reflects its throughput. Existing device fabrication systems with discrete processing chambers arranged radially around a transfer chamber have an upper limit in terms of number of wafers that can be processed per hour.

SUMMARY OF THE DISCLOSURE

In certain embodiments, the instant disclosure may be directed to a device fabrication system comprising a wafer input loadlock, a wafer output loadlock, one or more wafer processing regions, and one or more walking beams for transporting one or more wafers from the wafer input loadlock through the wafer processing regions, and onto the wafer output loadlock.

In other embodiments, the instant disclosure may be directed to a method for transporting one or more wafers. The method may comprise unloading a processed wafer into a wafer output loadlock by transporting one or more wafers through wafer processing regions in an output row with a third walking beam. The method may further comprise transporting a wafer from an input row to the output row with a second walking beam. The method may further comprise loading a new wafer from a wafer input loadlock into a wafer processing region in an input row by transporting one or more wafers through wafer processing regions in the input row with a first walking beam.

In a further embodiment, the instant disclosure may be directed to a method for transporting one or more wafers. The method may comprise transporting a new wafer from a wafer input loadlock into a wafer processing region by transporting one or more wafers through a row of wafer processing regions with a walking beam that is indexed to shift the one or more wafers to a next position.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
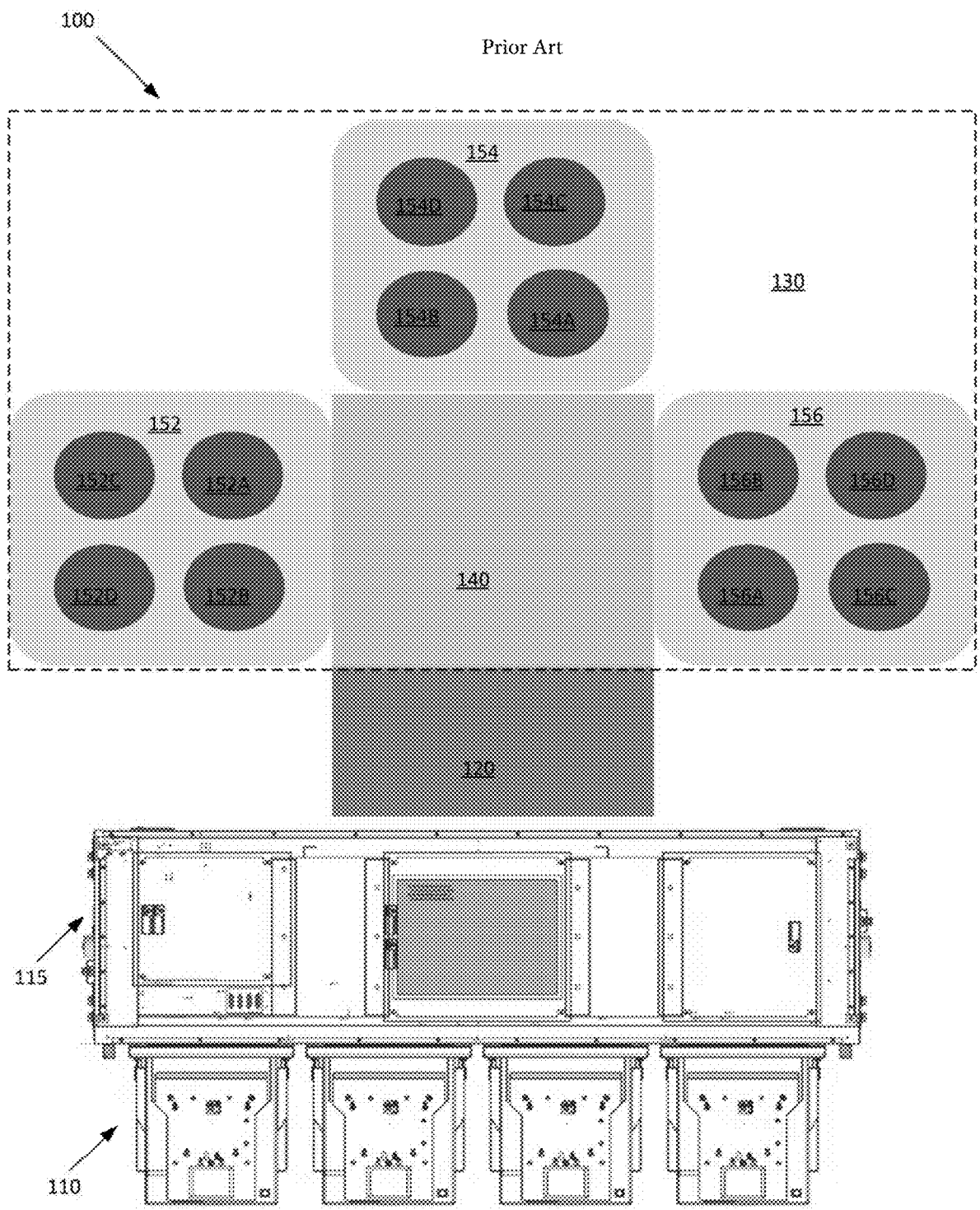
FIG. 1 depicts a top view of existing device fabrication systems with quad chambers.

With an ever increasing demand for semiconductor devices, device fabrication systems that reduce wafer processing time, reduce wafer processing chamber loading and unloading time, and increase wafer throughput while also being cost effective are beneficial. The present disclosure is directed to an architecture of a device fabrication system that allows for device processing in a continuous and efficacious manner that increases wafer throughput, reduces cost, enables improved service access and gas distribution, takes up less space, is compatible with existing wafer processing equipment, and is suitable for implementing a variety of processes. The device fabrication system in embodiments includes a large chamber that is approximately rectangular shaped, with a first dimension being orders of magnitude longer than a second dimension. The device fabrication system includes many processing regions. The device fabrication system uses one or more walking beam mechanisms to transport wafers between the processing regions. Certain embodiments of this disclosure may be described in further detail below with respect to the figures.

As used herein, the singular forms "a," "an," and "the" include plural references unless the context clearly indicates otherwise. Thus, for example, reference to "a wafer" includes a single wafer as well as a mixture of two or more wafers; and reference to a "wafer processing chamber" includes a single wafer processing chamber as well as a mixture of two or more wafer processing chambers, and the like.

As used herein, the term "about" in connection with a measured quantity, refers to the normal variations in that measured quantity, as expected by one of ordinary skill in the art in making the measurement and exercising a level of care of one skilled in the art and the precision of the measuring equipment. In certain embodiments, the term "about" includes the recited number±10%, such that "about 10" would include from 9 to 11.

As used herein, the term "transporting" refers to the actions of lifting and carrying an article (e.g., a wafer, a carrier, a carrier with a wafer) from one place to another place with the direction of a walking beam.

As used herein, the term "loading" refers to introduction of a new wafer into a wafer processing chamber.

As used herein, the term "unloading" refers to taking away a processed wafer from a wafer processing chamber.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

FIG. 1 is a top plan view showing a conventional device fabrication system 100 including a loading and storing apparatus 110, a factory interface 115, and a load lock 120 positioned adjacent a conventional processing tool 130. A factory interface (FI) 115 is shown positioned between the loading and storing apparatus 110 and load lock 120. The FI 115 includes an FI robot (not shown) that may move in FI 115 and may extract a wafer from the loading and storage apparatus 110. The FI robot may bring the wafer to a load lock 120. A main frame (MF) robot located at MF 140 (also referred to herein as a transfer chamber) may carry the wafer from load lock 120 to a processing chamber, such as quad processing chamber 152, 154, or 156. The MF robot may place the wafer into a processing region in a wafer receiving area of quad processing chamber 152, 154, or 156. The MF robot may have an upper blade and a lower blade and each blade may have two fingers. This design allows a MF robot to pick up two wafers at a time.

A typical loading and unloading sequence with a device fabrication system as depicted in FIG. 1 may include an FI robot in FI 115 extracting a first wafer from a loading and storage apparatus 110 (e.g., a front opening unified pod (FOUP)) and placing it in a loadlock 120. The FI robot may subsequently extract a second wafer from the loading and storage apparatus 110 and place it next to the first wafer in the loadlock 120. A MF robot may pick up the first and the second wafers, carry them to quad chamber 152, and load them in two wafer receiving areas 152A and 152B in respective wafer processing regions. Thereafter, quad chamber 152 may move the two wafers in wafer receiving areas 152A and 152B to wafer processing regions in the back so that the MF robot can access wafer receiving areas 152C and 152D. Each quad process chamber (152, 154, and 156) may have a carrousel design therein. The carrousel design allows rotation of the wafer receiving areas between wafer processing regions within each quad chamber. In this manner, each wafer receiving area within each quad chamber may be positioned in the front row at a certain time (at first and second wafer processing regions), making them accessible to the MF robot, being that the MF robot cannot directly access the rear two quad chamber wafer processing regions. In the meantime, the FI robot extracts two additional wafers from the loading and storage apparatus 110 and carries them to the loadlock 120 where the MF robot picks up the two additional wafers and brings them to quad chamber 152 into wafer receiving areas 152C and 152D at the front two wafer processing regions.

When all wafer receiving areas (and all of the wafer processing regions) in the quad chamber are filled, the quad processing chamber may begin processing the wafers at each of the wafer processing regions. In some instances, processing the wafer may involve moving the wafer receiving areas between multiple wafer processing regions to average out non-uniformities and improve process performance. Once processing is complete, the MF robot may unload processed wafers from the quad chamber and replace them with new wafers. The MF robot may bring the processed wafers to the loadlock and swap them for new wafers at the loadlock again.

Once quad chamber 152 is fully loaded, the process may repeat itself with the other quad chambers (154 and 156) by positioning wafers in wafer receiving areas 154A, 154B, 154C, 154D, 156A, 156B, 156C, and 156D of the quad chambers 154, 156.

The duration for fully loading each quad chamber could add up to about 40 seconds in duration per quad chamber. Although the above description with respect to FIG. 1 depicts a plurality of quad chambers (chambers including four wafer processing regions), some fabrication systems may have chambers with less or more wafer processing regions therein (e.g., twin chambers with two wafer processing regions in each or chambers with six wafer processing regions in each). The duration for fully loading each twin chamber may include the swap time (i.e., the time it takes a MF robot to swap and load two new wafers and unload two processed wafers). The swap time may be about 13 second. The existing quad chamber may be less efficient than the twin chamber because its loading and unloading time encompasses the time that it takes to move the stations (i.e., the wafer receiving areas) within the quad chamber. Chambers with more than two wafer processing regions with a similar mechanism may exhibit a similar inefficiency as that seen in the quad chamber.

In some instances, the time it takes to load and unload wafers in each quad chamber may start to exceed wafer processing time. It may take more time to stop chamber processing to get wafers in and out of the quad chamber than to process the wafers in the wafer processing chambers within a quad chamber. There have been attempts to make the MF robot operate faster in order to reduce the loading and unloading time. However, the challenge with long loading and unloading time remains. The added time for loading and unloading the processing chambers and processing the wafers may amount to a throughput of about 400 wafers per hour in some instances. It is beneficial to reduce the wafer loading and unloading times to increase throughput. The device fabrication systems described herein may be used without an MF robot altogether. Accordingly, in embodiments expense associated with the MF equipment, the MF space 140 space associated with the MF robot, and time associated with actions conventionally performed by a MF robot may be reduced or eliminated.

In embodiments, rather than using a MF connected to separate processing chambers, each having its own environment, a single large processing chamber may be used that transports wafers between wafer processing regions using a walking beam mechanism. Existing systems as described with reference to FIG. 1 operate as "single input single output" and "stop/start" systems. In contrast, the processing system described in embodiments uses a walking beam mechanism that would enable a continuous wafer processing flow.

Embodiments described herein set forth a new type of processing chamber that uses a walking beam mechanism to transport wafers between wafer processing regions. Multiple walking beam mechanisms may be used in some embodiments.

Figure 2:
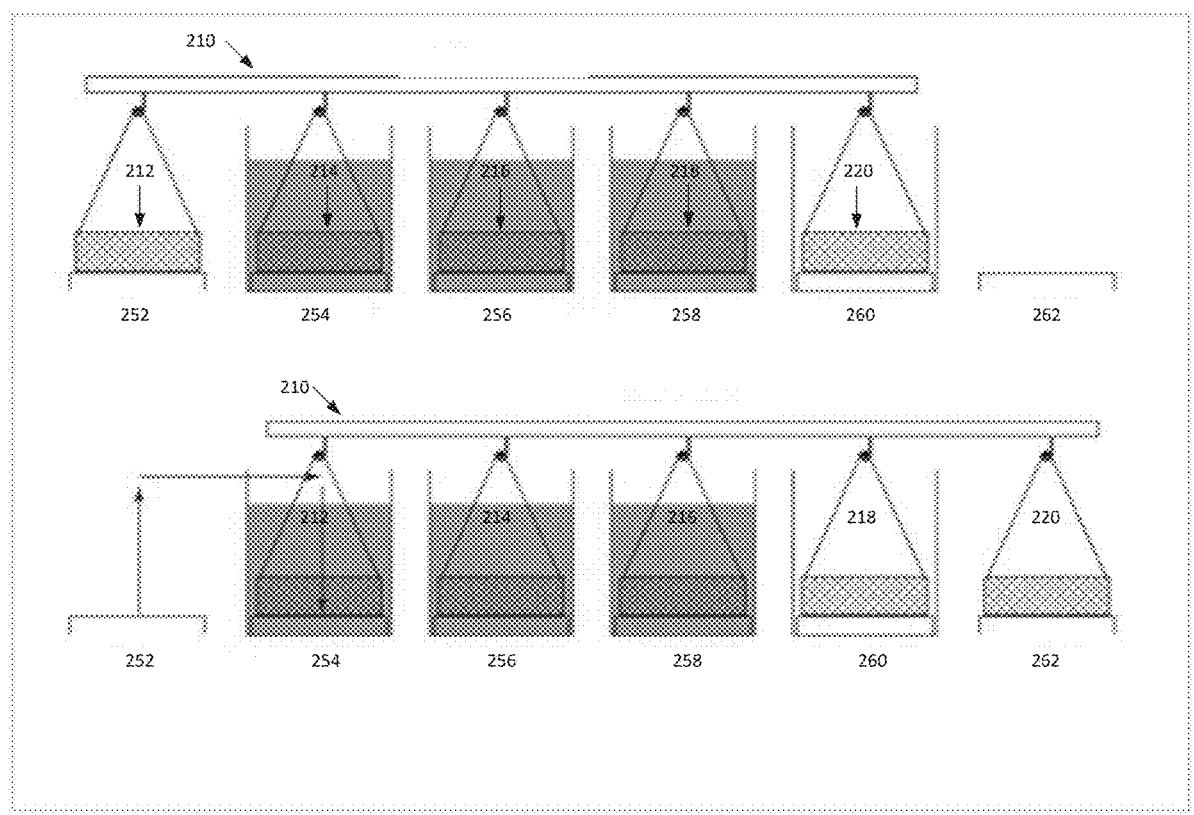
FIG. 2 depicts an illustration of a walking beam mechanism.

FIG. 2 depicts a walking beam mechanism that may be used to index wafers through a series of wafer processing regions in a device fabrication system according to an embodiment. The walking beam mechanism may have a concept that is similar to that of a conveyor belt. However, a conveyor belt design would not hand off a wafer to a processing region. In contrast, a walking beam would hand off the wafer to a wafer processing region as it may lift the wafer from one wafer processing region, index it over to the next wafer processing region, and then optionally lower it onto the next wager processing region. In FIG. 2, walking beam 210 may transport all wafers 212, 214, 216, 218, and 220 simultaneously from positions 252, 254, 256, 258, and 260, respectively, to their next indexed position, e.g., one over to positions 254, 256, 258, 260, and 262, respectively. Exemplary methods of transporting wafers across a wafer processing chamber (e.g., between wafer processing regions in the processing chamber) using the walking beam mechanism of FIG. 2 in the device fabrication system described herein is further described with respect to FIGS. 4A-4F below.

Figure 3:
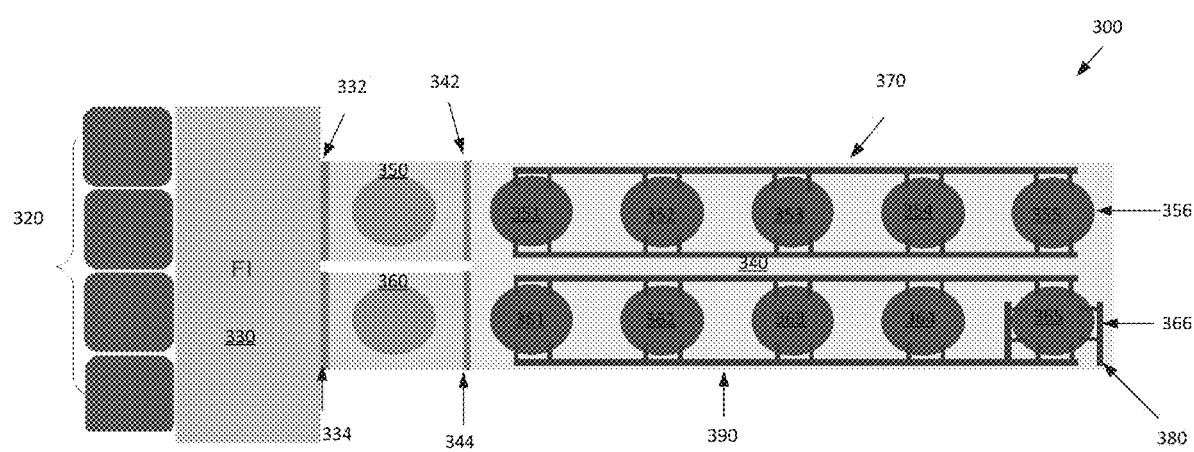
FIG. 3 depicts a top view of a device fabrication system with a walking beam mechanism according to an embodiment.

FIG. 3 is a top plan view showing a device fabrication system 300 according to an embodiment. The device fabrication system may have a rectangular shape, with a length that is many times longer than a width. The device fabrication system may include two or more rows of wafer processing regions 351-365. For example, as shown wafer processing regions 351-355 are in an input row 356, and wafer processing regions 361-365 are in an output row 366. Though two rows of wafer processing regions are shown, a single row may be used, or more than two rows may be used.

Device fabrication system 300 may comprise a wafer input loadlock 350 in line with input row 356 and a wafer output loadlock 360 in line with output row 366. Each of input row 356 and output row 366 may comprise one or more wafer processing regions, such as wafer processing regions 351, 352, 353, 354, and 355 in input row 356 and wafer processing regions 361, 362, 363, 364, and 365 in output row 366. The wafer input loadlock 350 and the wafer output loadlock 360 may be coupled to input row 355 and output row 365, respectively (e.g., bolted together). Similarly, each of the processing regions in input row 355 and in output row 366 may be coupled to each other (e.g., bolted together or to a common floor or support structure).

Wafer input loadlock 350 and wafer output loadlock 360 may be positioned laterally on the same plane. In certain embodiments, the wafer input loadlock 350, wafer output loadlock 360, input row 356, and output row 366 may all be on the same plane.

Wafer processing regions 351-355 in input row 356 and wafer processing regions 361-365 in output row 366 may be together enclosed in a common elongated chamber 340. The processing regions may be arranged to perform conventional device fabrication processes such as chemical vapor deposition, physical vapor deposition, atomic layer deposition, etching, cleaning, oxidation, thin film deposition, heat treatment, degassing, cool down, etc. Some processing regions may be configured to perform the same type of process (e.g., multiple wafer processing regions may perform deposition processes). Additionally, different wafer processing regions may perform different types of processes. For example, a first wafer processing region may be configured to perform ALD processes, while a second wafer processing region may be configured to perform physical vapor deposition processes, and/or a third wafer processing region may be configured to perform oxidation processes. In some embodiments, the processing regions are configured to perform device fabrication processes under vacuum. In an embodiment, all processing regions enclosed in the common elongated chamber share the same interior volume of the elongated chamber. Accordingly, the processing regions may share a common pressure. Similarly, all processing regions may share other commonalities, such as, without limitations, cooling water, power, and the like.

In an example, a processing region (such as processing regions 351-355 and 361-365 in FIGS. 3-4F) may include a wafer support assembly, an electrostatic chuck (ESC), a ring (e.g., a process kit ring or single ring), a chamber wall, a base, a gas distribution plate, a showerhead, gas lines, a nozzle, a lid, a liner, a liner kit, a shield, a plasma screen, a flow equalizer, a cooling base, a chamber viewport, a chamber lid, and so on.

In one embodiment, the processing region includes a body and a showerhead that enclose an interior volume. The showerhead may include a showerhead base and a showerhead gas distribution plate. Alternatively, the showerhead may be replaced by a lid and a nozzle in some embodiments. The body may be fabricated from aluminum, stainless steel or other suitable material. The body generally includes sidewalls and a bottom. An outer liner may be disposed adjacent the sidewalls to protect the body.

An exhaust port may be defined in the body, and may couple the interior volume to a pump system. The pump system may include one or more pumps and throttle valves utilized to evacuate and regulate the pressure of the interior volume of the processing region. The interior volume of the processing region may not be sealed off from an interior volume of the elongate processing chamber that contains the processing region.

The showerhead may be supported on the sidewall of the body. A gas panel may be coupled to the processing region to provide process and/or cleaning gases to the interior volume through the showerhead (or a lid and nozzle). The wafer support assembly is disposed in the interior volume of the processing region below the showerhead or lid. The wafer support assembly holds the wafer during processing. A ring (e.g., a single ring) may cover a portion of the electrostatic chuck, and may protect the covered portion from exposure to plasma during processing. The ring may be silicon or quartz in one embodiment.

An inner liner may be coated on the periphery of the wafer support assembly. The inner liner may be a halogen-containing gas resistant material such as those discussed with reference to the outer liner. In one embodiment, the inner liner may be fabricated from the same materials as those of outer liner.

Returning to FIG. 3, device fabrication system 300 may further comprise one or more walking beams 370, 380, and 390 for transporting one or more wafers through the wafer processing regions 351-355 and 361-365 in accordance the mechanism described with respect to FIG. 2. In an embodiment, a first walking beam 370 may be suitable for transporting one or more wafers from wafer input loadlock 350 and through the wafer processing regions 351-355 in input row 356. A second walking beam 380 may be suitable for transporting a wafer from input row 356 to output row 366 (e.g., from wafer processing region 355 to wafer processing region 365). A third walking beam 390 may be suitable for transporting one or more wafers through the wafer processing regions 365-361 in output row 366 and finally onto wafer output loadlock 360. Each walking beam may be operated by an actuator.

In certain embodiments, the walking beam and the actuator may be enclosed in the common elongated chamber along with all of the wafer processing regions. In other embodiments, the walking beam and the actuator may be outside the common elongated chamber. In further embodiments, the walking beam may be inside the common elongated chamber along with all of the wafer processing regions and the actuator may be outside the common elongated chamber.

The design of the walking beam and their actuator is not limited and may include, for instance, one or more of shafts, bellows, linear motors, linear bearings, magnets, and so on. In one embodiment, the walking beam and actuator mechanism may comprise one or more shafts on each side of the common elongated chamber. The shafts may be isolated from the common elongated chamber environment (e.g., vacuum or corrosive gases) using bellows. The shafts may slide in a forward and backward direction via a mechanism that may optionally reside outside the common elongated chamber. In other embodiments, the walking beam and actuator may comprise two bars tied together and coupled to a linear motor to move the bars. In certain embodiments, linear bearings and linear motors may be utilized to move a walking beam enclosed along with the processing regions in the common elongated chamber. In some embodiments, a levitated linear motor may be used to move the walking beam (e.g., when it is enclosed in a high vacuum environment in a common elongated chamber).

In certain embodiments, each wafer processing region may have a separate walking beam and actuator as opposed to a common walking beam and actuator for the entire row of wafer processing regions. Similarly, in some embodiments, a plurality of wafer processing regions (e.g., two, three, and so on) may have a common walking beam and actuator. The variations in walking beam positions and/or designs may provide wafer processing flexibility. For instance, a walking beam may be programmed to transport the wafer into certain wafer processing regions while skipping certain other wafer processing regions.

In some embodiments, each wafer may undergo processing in each and every one of the wafer processing regions in the device fabrication system. In another embodiment, a wafer may undergo processing in certain wafer processing regions and skip other wafer processing regions. The processing route that each wafer may take through the fabrication system may depend, among other factors, on the length of the walking beam, its position, its design, its actuator, and how it is programmed to transport a wafer among the wafer processing regions (i.e., the indexed position of each wafer).

The processing of each wafer may be split up across a plurality of wafer processing regions. Some or all wafer processing regions may operate simultaneously. For example, each of the wafer processing regions 351-365 may perform a respective process (e.g., a deposition process, etch process, etc.) on a different wafer concurrently. Another example may be where the wafer undergoes deposition of a layered stack of different materials. The wafer may have one material deposited in one wafer processing region and another material deposited in another wafer processing region and so on. The systems described herein enable a plurality of wafers to be processed simultaneously. The designs of the device fabrication systems described herein may be customized to a particular process. For example, an entire sequence of processes may be performed on a collection of wafers that move through the device fabrication system 300. Accordingly, the single device fabrication system 300 may be a replacement to a traditional device fabrication system that includes a transfer chamber coupled to multiple quad chambers, single chambers, and/or dual chambers.

If different processes with incompatible chemistries occur in adjoining wafer processing regions, it may be possible to generate a gas curtain shield to avoid cross-contamination between the wafer processing regions. Gas curtain shields may be generated by flowing gas through an area separating adjacent wafer processing regions to catch contaminant particles (and optionally plasmas, gases, etc.) in the gas so that these particles (and optionally plasmas, gases, etc.) do not contaminate the adjacent wafer processing regions. Cross-contamination may also be reduced by purging and pumping (i.e., drawing into vacuum incompatible gases and replacing them with inert gas shields).

In certain embodiments, the wafers transported through the wafer processing chambers may be temporarily mounted on carriers and the one or more walking beams may interface with and transport the carriers along with the wafers thereon.

One of the advantages of device fabrication system disclosed herein includes its adaptability to existing processing equipment. For instance, the device fabrication system described herein may be used with a pedestal heater having an electronic chuck positioned thereon, a shower head above the pedestal heater and electronic chuck, and radio frequency (RF) delivery system further on top, as is used in some existing device fabrication systems. In certain embodiments, standard chamber lifts (e.g., lift pins) may be used for the vertical motion associated with lifting a wafer from a wafer processing region onto a carrier of a walking beam and/or lowering the wafer from the carrier of the walking beam onto the wafer processing region.

In certain embodiments (not shown in the figures), the one or more wafer processing regions may all be in a single row having a wafer input loadlock at one end of the row and a wafer output loadlock at another end of the row. In this embodiment, one or more walking beams may transport one or more wafers from the wafer input loadlock, through the wafer processing regions, and finally to the wafer output loadlock. With this arrangement, the wafer input loadlock, wafer processing regions, and wafer output loadlock may all be arranged in one line and on one plane.

In other embodiments (not shown in the figures), the one or more wafer processing regions may be arranged in three rows. A wafer input loadlock may be positioned at a first end of a first row. A wafer output loadlock may be positioned at the first end or at an opposite end of a second row or third row. A first walking beam may move wafers between processing regions in the first row. A second walking beam may move wafers between processing regions in the second row. A third walking beam may move wafers between processing regions in the third row. A fourth walking beam may be positioned at the first end and may move wafers between the first, second and/or third rows. Additionally or alternatively, a fifth walking beam may be positioned at the opposite second end and may move wafers between the first, second and/or third rows.

In other embodiments (not shown in the figures), the one or more wafer processing regions may be arranged in four rows. A wafer input loadlock may be positioned at a first end of a first row. A wafer output loadlock may be positioned at the first end or at an opposite end of a second row, a third row, or a fourth row. A first walking beam may move wafers between processing regions in the first row. A second walking beam may move wafers between processing regions in the second row. A third walking beam may move wafers between processing regions in the third row. A fourth walking beam may move wafers between processing regions in the fourth row. A fifth walking beam may be positioned at the first end and may move wafers between the first, second, third and/or fourth rows. Additionally or alternatively, a sixth walking beam may be positioned at the opposite second end and may move wafers between the first, second, third and/or fourth rows. In one embodiment, the fifth walking beam is positioned at the second end (far end from the input load lock) and moves wafers from the first row to the second row. In this embodiment, the sixth walking beam is positioned at the first end (near end to the input load lock) and moves wafers from the second row to the third row. In this embodiment, a seventh walking beam is positioned at the second end (far end from the input load lock) and moves wafers from the third row to the fourth row. The output loadlock may be on the first end of a fourth row.

In order to allow for continuous wafer processing through wafer processing regions (e.g., 351-355 and 361-365), the common elongated chamber 340 may be separated from the wafer input loadlock and the wafer output loadlock. In an embodiment, the common elongated chamber (e.g., 340) is separated from the wafer input loadlock (e.g., 350) with input slit valve (e.g., 342) and from wafer output loadlock (e.g., 360) with output slit valve (e.g., 344). Such an arrangement may enable continuous wafer processing without having to stop wafer processing and restart wafer processing each time a new wafer is placed into the wafer input loadlock and a processed wafer is removed from the wafer output loadlock. The slit valves may effectively isolate the common elongated chamber 340 from the wafer input loadlock 350 and from the wafer output loadlock 360. This isolation may enable maintenance of a controlled environment in the common elongated chamber, such as a controlled pressure and temperature.

Device fabrication system 300 may further comprise a factory interface (FI) 330 similar to that of a conventional device fabrication system (such as factory interface 115 in system 100 of FIG. 1) and a loading and storing apparatus 320 (such as apparatus 110 in system 100 in FIG. 1). FI 330 may include a FI robot that may extract new wafers from loading and storing apparatus 320 and place them into wafer input loadloack 350. The FI robot may also remove processed wafers from wafer output loadlock 360 and bring them to loading and storing apparatus 320.

FI 330 may be separated from wafer input loadlock 350 with input door 332 and from wafer output loadlock 360 with output door 334. The doors may effectively isolate the wafer input loadlock, wafer output loadlock, and common elongated chamber 340 (when the input slit valve and/or output slit valve are open) from the FI. This isolation may enable maintenance of a controlled environment in the common elongated chamber, such as a controlled pressure, moisture and/or temperature.

The device fabrication systems described herein may comprise any number of wafer processing regions ranging from 1 to 50, from 2 to 40, from 3 to 30, from 4 to 24, from 4 to 20, from 6 to 20, from 6 to 16, from 8 to 16, from 8 to 12, or any single number or range in between. In an embodiment where all wafer processing regions are arranged in one row, the number of wafer processing regions may be odd or even. In an embodiment where the wafer processing regions are arranged in two rows (i.e., input row and output row as shown in FIG. 3), the number of wafer processing regions will likely be even.

Each wafer processing region may have dimensions of about 22"×22", about 23"×23", about 24"×24", about 26"×26", about 28"×28", about 30"×30", about 34"×34", and so on in some embodiments. The dimensions of a common elongated chamber enclosing all wafer processing regions may be calculated based on the dimensions of each wafer processing region and the total number of wafer processing regions. In certain embodiments (e.g., as depicted in FIG. 3), the common elongated chamber may have a length of about 120" (24" per wafer processing region×5 wafer processing regions per row) and a width of about 48". These dimensions are merely exemplary and should not be construed as limiting.

The footprint of the device fabrication systems described herein may encompass the space taken by the loading and storing apparatus, factory interface, wafer input loadlock, wafer output loadlock, and common elongated chamber (enclosing the wafer processing regions). The systems described herein may have a smaller footprint and save space as compared to conventional device fabrication systems of the type depicted in FIG. 1 by excluding a MF body and a MF robot. Removing the MF content may also reduce cost that would otherwise be expended on volume and hardware for the MF (e.g., minimum number of slit valves may be used, no MF robot, no MF body).

The continuous wafer processing sequence in the device fabrication system of FIG. 3 may be described in further detail with respect to FIGS. 4A-4F. To start, walking beams 370, 380, and 390 may be enclosed along with wafer processing regions 351-355 and 361-365 in the common elongated chamber 340. Walking beam 370 may be positioned over wafer processing regions 351-355. Walking beam 380 may be positioned along wafer processing region 365 in output row 356. Walking beam 390 may be positioned along wafer processing regions 361-365. This may be referred to as the "starting position" for each of the walking beams 370, 380, and 390 in the description below.

Figure 4A:
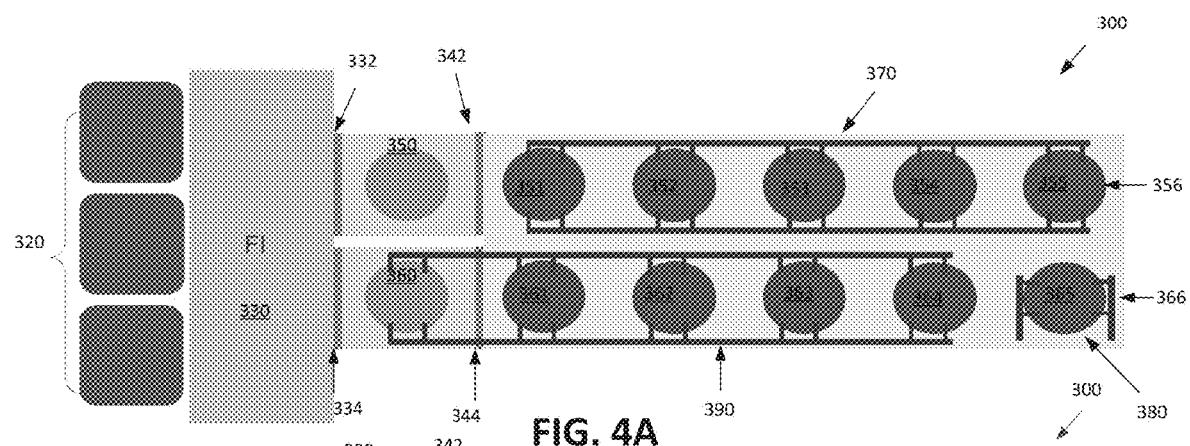
FIGS. 4A-4F illustrate a process for transporting a wafer through a device fabrication system with a walking beam mechanism according to an embodiment.
Figure 4B:
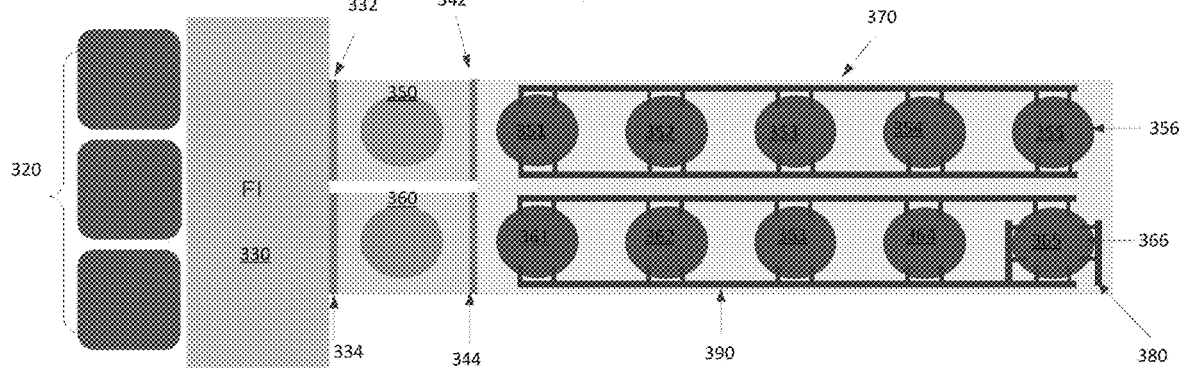

Referring to FIG. 4A, output slit valve 344 may open. Walking beam 390 may unload a processed wafer into a wafer output loadlock 360. This may occur by the walking beam transporting all five wafers (or carriers with or without wafers in case any of the carriers is empty) in wafer processing regions 365, 364, 363, 362, and 361 and transporting them all over simultaneously to the next indexed position. For instance, the next indexed position may have all the wafers transported to the next adjacent wafer processing region in the output row (i.e., into wafer processing regions 364, 363, 362, 361, and wafer output loadlock 360). Referring to FIG. 4B, walking beam 390 may return back to the starting position where it may be enclosed along with the wafer processing regions in the common elongated chamber 340 and may be positioned along wafer processing regions 361-365.

Figure 4C:
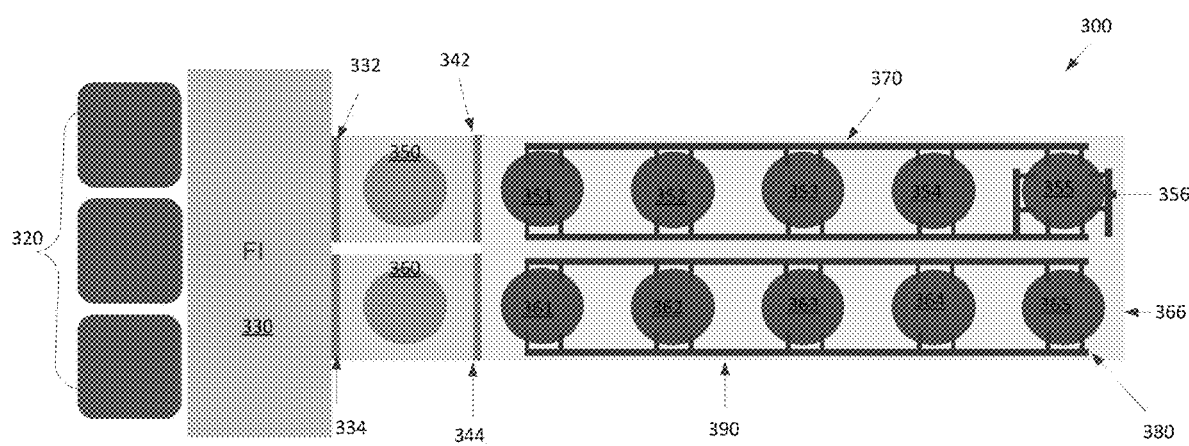
Figure 4D:
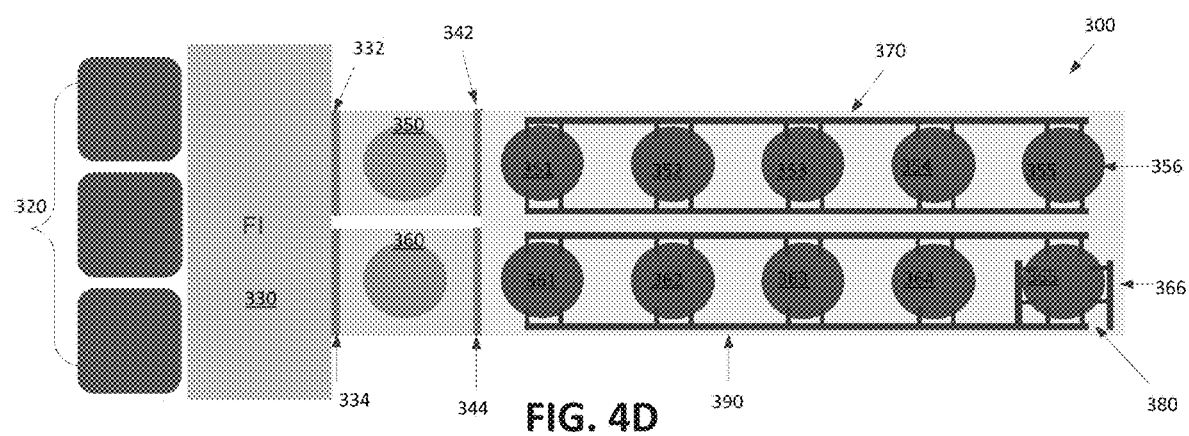

Referring to FIGS. 4C-4D, walking beam 380 may transport a wafer (or carrier with or without a wafer) from wafer processing region 355 in input row 356 to the next indexed position (i.e., into wafer processing region 365 in output row 366).

During this time, an FI robot may extract a new wafer from loading and storing apparatus 320, and bring the new wafer into wafer input loadlock 350 through open input door 332. After placing the new wafer into wafer input loadlock 350, the FI robot may remove the processed wafer from wafer output loadlock 360 via output door 334.

Figure 4E:
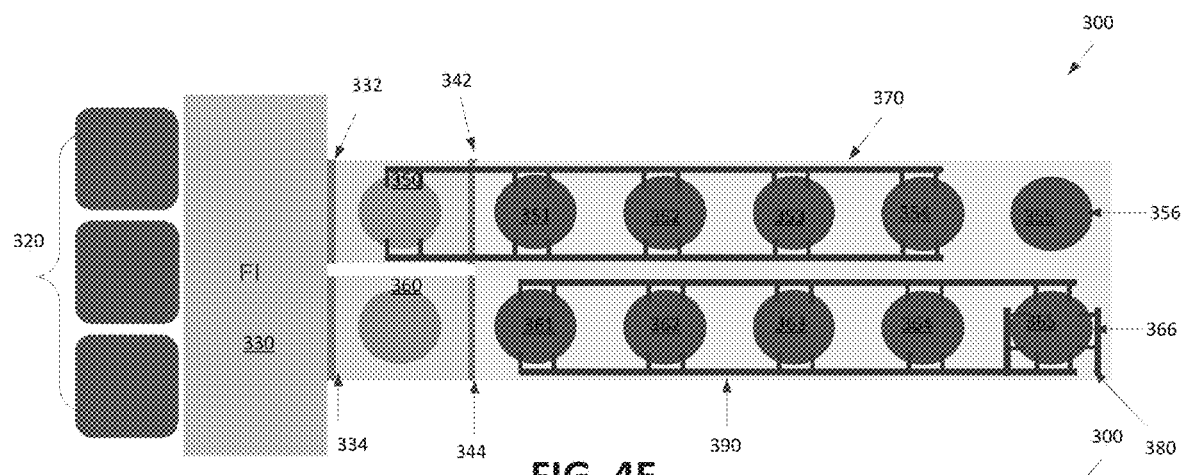
Figure 4F:
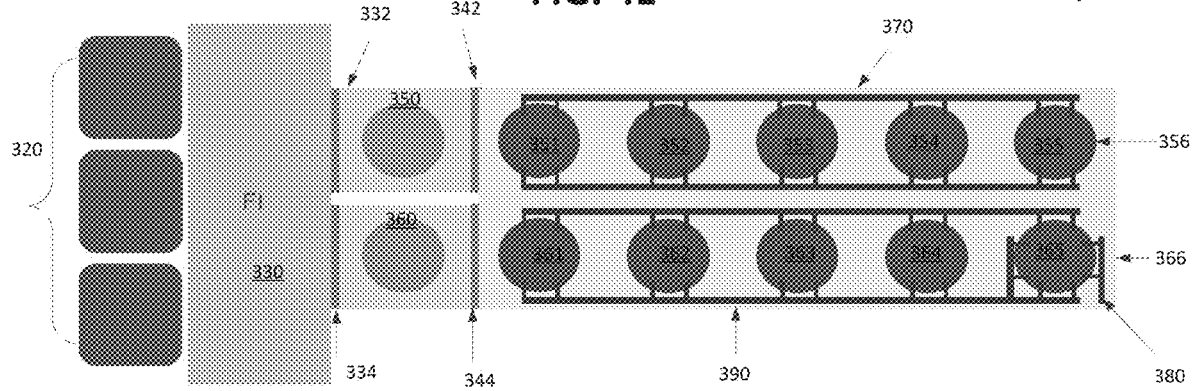

In the meantime, input door 332 may close and the pressure in wafer input loadlock 350 may be pumped down to reach a vacuum. Once the pressure in wafer input loadlock 350 reaches the same value as the pressure level of the common elongated chamber 340, input slit valve 342 may open. Referring to FIG. 4E, walking beam 370 may then load the new wafer from the wafer input loadlock into a wafer processing region in the input row. This may occur by the walking beam transporting all five wafers (or carriers with or without wafers in case any of the carriers is empty) in wafer input loadlock 350 and in wafer processing regions 351, 352, 353, and 354 to the next indexed position. For instance, the next indexed position may include transporting all the wafers by one as shown in FIG. 4F (i.e., into wafer processing regions 351, 352, 353, 354, and 355).

In certain embodiments, the method for transporting one or more wafers through the device fabrication systems described herein may comprise transporting a new wafer from a wafer input loadlock into a wafer processing region. The transporting may occur by having a walking beam lift and carry one or more wafers simultaneously to the next indexed position in a row of wafer processing regions.

The methods described herein may operate when all wafer processing regions have wafers being processed therein as well as when some but not all wafer processing regions have wafers being processed therein. For instance, when the wafer processing regions in the common elongated chamber are empty, the methods described herein may be followed to gradually populate one or more of the wafer processing regions. Initially, a first new wafer may be placed in the wafer input loadlock by an FI robot. The walking beam mechanism may lift the first wafer and carry it over to the next indexed position (which may be the immediately adjoining wafer processing region). Thereafter and while the first wafer is being processed in its wafer processing region, the FI robot may place a second wafer in the wafer input loadlock and the walking beam mechanism may lift the first and the second wafer simultaneously and carry them to the next indexed position. This process may repeat itself continuously to further load additional new wafers to be processed in the wafer processing regions. Unlike in existing chambers (such as the quad chamber), wafers that are inside a wafer processing region may be processed while a new wafer gets introduced into the wafer input loadlock and thereafter into the common elongated chamber. Wafer processing does not stop for introduction of new wafers or for removal of processed wafers. The same actions may be performed whether the common elongated chamber is fully loaded, stagger loaded, every other wafer processing region is loaded, empty, or in any other arrangement.

The continuous nature of the wafer transport method described herein may improve the wafer throughput. Wafer throughput of systems described herein may be related to the indexing time associated with transporting a wafer from one position to the next indexed position (using the walking beam mechanism) and the wafer processing time. For instance, with the device fabrication system depicted in FIGS. 3-4F and a transfer time of about 5 second between wafer processing regions, the throughput could reach about 720 wafers per hour.

In some embodiments, the transfer time of transporting a wafer from one wafer processing region to another is about 10 second or less, about 8 second or less, about 6 seconds or less, about 5 seconds or less, about 4 seconds or less, about 3 seconds or less, about 1 second to about 10 seconds, about 1.5 seconds to about 8 seconds, about 2 seconds to about 6 seconds, or any particular number or range in between, in duration.

In certain embodiments, the wafer transport method described herein comprises processing about 450 or more, about 500 or more, about 550 or more, about 600 or more, about 650 or more, about 700 or more, about 450 to about 1000, about 500 to about 900, about 600 to about 800, or any particular number or range in between, wafers per hour.

The device fabrication systems disclosed herein may also provide for improved service access and gas distribution. For instance, commonalities (such as common pressure, gas, cooling water, power and the like) may be distributed to all wafer processing regions enclosed in the common elongated chamber 340. For instance, gases may be distributed to the common elongated chamber 340 down the center and every region may be accessed.

In certain embodiments, wafer processing regions with special designs may also be incorporated into the device fabrication system. For instance, wafer processing region designs that incorporate a cup around a heater and a top pumping interface may integrate well with a walking beam mechanism described herein.

Some wafer processes (e.g., thin film deposition) may deposit material on chamber components and not only on the wafer itself. Cleaning processes may be implemented to remove such contaminants. Cleaning processes of the wafer processing regions and/or of the common elongated chamber may also be implemented in the fabrication systems described herein. For instance, cleaning may be performed by running a process without any wafers (skipping a wafer load). In some instances, an FI robot may place a dummy wafer in the wafer input loadlock to load a dummy wafer into the device fabrication system. A dummy wafer may be used when the top surface of the heater in a wafer processing region is to be protected. In some instances, the top surface of the heater in the wafer processing region need not be protected and a dummy wafer may not be used during a cleaning process (the cleaning may occur by skipping a wafer load for example).

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

The present disclosure has been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

What is claimed is:

1. A device fabrication system comprising:
   two or more adjacent rows, wherein the two or more adjacent rows comprise:
      a wafer input loadlock in line with an input row comprising one or more wafer processing regions;
      a wafer output loadlock in line with an output row comprising one or more wafer processing regions; and
      one or more walking beams for transporting one or more wafers from the wafer input loadlock, through the wafer processing regions, and onto the wafer output loadlock.

2. The device fabrication system of claim 1, wherein the one or more walking beams comprise a first walking beam for transporting one or more wafers through the wafer processing regions in the input row, a second walking beam for transporting a wafer from the input row to the output row, and a third walking beam for transporting one or more wafers through the wafer processing regions in the output row.

3. The device fabrication system of claim 1, wherein the wafer input loadlock and the wafer output loadlock are positioned laterally on the same plane.

4. The device fabrication system of claim 1, wherein the one or more wafer processing regions are enclosed in a common elongated chamber under a vacuum.

5. The device fabrication system of claim 4, wherein the common elongated chamber is separated from the wafer input loadlock and from the wafer output loadlock with an input slit valve and an output slit valve, respectively.

6. The device fabrication system of claim 4, wherein the one or more walking beams are inside the common elongated chamber.

7. The device fabrication system of claim 4, wherein the one or more walking beams are outside the common elongated chamber.

8. The device fabrication system of claim 1, further comprising a factory interface that is separated from the wafer input loadlock and from the wafer output loadlock with an input door and an output door, respectively.

9. The device fabrication system of claim 1, wherein the one or more wafer processing regions comprise one or more of a chemical vapor deposition chamber, a physical vapor deposition chamber, an atomic layer deposition chamber, or an etch process chamber.

10. The device fabrication system of claim 1, wherein one or more wafer processing regions, the wafer input loadlock, and the wafer output loadlock are on the same plane.

11. A method for transporting one or more wafers, comprising:
   unloading a processed wafer into a wafer output loadlock by transporting one or more wafers through one or more wafer processing regions in an output row with a third walking beam;
   transporting a wafer from an input row to the output row with a second walking beam, wherein the input row and the output row are two adjacent rows; and
   loading a new wafer from a wafer input loadlock into a wafer processing region in an input row by transporting one or more wafers through one or more wafer processing regions in the input row with a first walking beam.

12. The method of claim 11, wherein each of the unloading the processed wafer, the transporting the wafer from the input row to the output row, and the loading the new wafer, are 10 seconds or less in duration.

13. The method of claim 12, processing about 450 or more wafers per hour.

14. The method of claim 11, further comprising removing the processed wafer from the wafer output loadlock and placing the new wafer into the wafer input loadlock by a factory interface robot.

15. The method of claim 11, wherein the first walking beam, the second walking beam, and the third walking beam transport the one or more wafers by lifting them and carrying to a next indexed wafer processing region or to the wafer output loadlock.

16. The method of claim 11, wherein the wafer processing regions in the input row and the wafer processing regions in the output row comprise one or more of a chemical vapor deposition chamber, a physical vapor deposition chamber, an atomic layer deposition chamber, or an etch process chamber.

17. A method for transporting one or more wafers, comprising transporting a new wafer from a wafer input loadlock into a wafer processing region by lifting and carrying one or more wafers through two or more adjacent rows of wafer processing regions with two or more walking beams that are indexed to shift the one or more wafers to a next position, wherein the wafer input loadlock and a wafer output loadlock are each in line with a respective row of the two or more adjacent rows.

18. The method of claim 17, processing about 450 or more wafers per hour.

* * * * *